(12) United States Patent
Gilda et al.

(10) Patent No.: US 10,601,448 B2
(45) Date of Patent: Mar. 24, 2020

(54) REDUCED LATENCY ERROR CORRECTION DECODING

(71) Applicant: INTERNATIONAL BUSINESS MACHINES CORPORATION, Armonk, NY (US)

(72) Inventors: Glenn Gilda, Binghamton, NY (US); Patrick J. Meaney, Poughkeepsie, NY (US); Arthur O'Neill, Poughkeepsie, NY (US); Barry M. Trager, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 43 days.

(21) Appl. No.: 15/830,526

(22) Filed: Dec. 4, 2017

(65) Prior Publication Data

US 2018/0367166 A1 Dec. 20, 2018

Related U.S. Application Data

(60) Provisional application No. 62/521,128, filed on Jun. 16, 2017.

(51) Int. Cl.
*H03M 13/15* (2006.01)
*H03M 13/00* (2006.01)

(52) U.S. Cl.
CPC ..... *H03M 13/1515* (2013.01); *H03M 13/158* (2013.01); *H03M 13/1575* (2013.01); *H03M 13/6502* (2013.01); *H03M 13/6561* (2013.01)

(58) Field of Classification Search
CPC ................................................ H03M 13/1515
See application file for complete search history.

(56) References Cited

U.S. PATENT DOCUMENTS

| 4,637,021 A | * | 1/1987 | Shenton | H03M 13/15 714/756 |
| 4,763,330 A | * | 8/1988 | Shimizu | H03M 13/15 714/761 |
| 5,541,940 A | * | 7/1996 | Akita | H03M 13/151 714/704 |

(Continued)

FOREIGN PATENT DOCUMENTS

WO 9524769 A2 9/1995

OTHER PUBLICATIONS

POU820160426PCT01-ISR/WO dated Oct. 10, 2018.

(Continued)

*Primary Examiner* — Steve N Nguyen
(74) *Attorney, Agent, or Firm* — Cantor Colburn LLP; William Kinnaman

(57) ABSTRACT

Systems, methods, and computer-readable media are disclosed for performing reduced latency error decoding using a reduced latency symbol error correction decoder that utilizes enumerated parallel multiplication in lieu of division and replaces general multiplication with constant multiplication. The use of parallel multiplication in lieu of division can provide reduced latency and replacement of general multiplication with constant multiplication allows for logic reduction. In addition, the reduced symbol error correction decoder can utilize decode term sharing which can yield a further reduction in decoder logic and a further latency improvement.

16 Claims, 9 Drawing Sheets

(56) References Cited

U.S. PATENT DOCUMENTS

| | | | |
|---|---|---|---|
| 5,901,158 A | 5/1999 | Weng et al. | |
| 6,421,805 B1* | 7/2002 | McAuliffe | G06F 11/10 |
| | | | 714/756 |
| 7,418,645 B2* | 8/2008 | Srivastava | G11B 20/12 |
| | | | 714/758 |
| 8,707,143 B1 | 4/2014 | Langhammer | |
| 2002/0104059 A1 | 8/2002 | Baroncelli et al. | |
| 2004/0078408 A1 | 4/2004 | Miller et al. | |
| 2005/0081131 A1* | 4/2005 | Ball | G11B 20/1833 |
| | | | 714/758 |
| 2005/0138533 A1 | 6/2005 | Le Bars et al. | |
| 2006/0031741 A1 | 2/2006 | Ou et al. | |

OTHER PUBLICATIONS

Dilip V. Sarwate et al., "High-Speed Architectures for Reed-Solomon Decoders", IEEE Transactions On Very Large Scale Integration (VLSI) Systems, vol. 9, No. 5, Oct. 2001, pp. 641-655.

\* cited by examiner

REDUCED LATENCY ERROR CORRECTION DECODING

CROSS-REFERENCE TO RELATED APPLICATION(S)

This application claims the benefit of U.S. Provisional Application No. 62/521,128, filed on Jun. 16, 2017, the contents of which are hereby incorporated by reference.

BACKGROUND

An error correcting code (ECC) is used to encode a message in a redundant manner so as to control errors in data transmission over unreliable or noisy communication channels. As computer systems become increasingly dense and complex, trade-offs are often made between cost, performance, density, and reliability, availability, and serviceability (RAS). The type of error correcting code that is used can influence the type of trade-offs that are made. For example, for large cache designs, an increased density may be achieved at the cost of high latency associated with error correction.

SUMMARY

In one or more example embodiments of the disclosure, a computer-implemented method for performing reduced latency error decoding of a received codeword that comprises a set of input symbols is disclosed. The method includes determining a first syndrome, a second syndrome, and a third syndrome associated with the received codeword and determining that at least one of the first syndrome, the second syndrome, or the third syndrome is non-zero. The method further includes determining a set of constant multipliers and performing a multiplication of the first syndrome with each constant multiplier in the set of constant multipliers to generate a set of products. The method additionally includes determining, based at least in part on the set of products, that a first condition is satisfied with respect to the second syndrome and determining that a second condition is satisfied with respect to the third syndrome. A single input symbol in the received codeword that contains one or more bit errors is then identified based at least in part on the first condition and the second condition being satisfied and the one or more bit errors in the single input symbol are corrected to obtain an original codeword.

In one or more example embodiments of the disclosure, a system for performing reduced latency error decoding of a received codeword that comprises a set of input symbols is disclosed. The system includes at least one memory storing computer-executable instructions and at least one processor configured to access the at least one memory and execute the computer-executable instructions to perform a set of operations. The operations include determining a first syndrome, a second syndrome, and a third syndrome associated with the received codeword and determining that at least one of the first syndrome, the second syndrome, or the third syndrome is non-zero. The operations further include determining a set of constant multipliers and performing a multiplication of the first syndrome with each constant multiplier in the set of constant multipliers to generate a set of products. The operations additionally include determining, based at least in part on the set of products, that a first condition is satisfied with respect to the second syndrome and determining that a second condition is satisfied with respect to the third syndrome. A single input symbol in the received codeword that contains one or more bit errors is then identified based at least in part on the first condition and the second condition being satisfied and the one or more bit errors in the single input symbol are corrected to obtain an original codeword.

In one or more example embodiments of the disclosure, a computer program product for performing reduced latency error decoding of a received codeword that comprises a set of input symbols is disclosed. The computer program product includes a storage medium readable by a processing circuit. The storage medium stores instructions executable by the processing circuit to cause a method to be performed. The method includes determining a first syndrome, a second syndrome, and a third syndrome associated with the received codeword and determining that at least one of the first syndrome, the second syndrome, or the third syndrome is non-zero. The method further includes determining a set of constant multipliers and performing a multiplication of the first syndrome with each constant multiplier in the set of constant multipliers to generate a set of products. The method additionally includes determining, based at least in part on the set of products, that a first condition is satisfied with respect to the second syndrome and determining that a second condition is satisfied with respect to the third syndrome. A single input symbol in the received codeword that contains one or more bit errors is then identified based at least in part on the first condition and the second condition being satisfied and the one or more bit errors in the single input symbol are corrected to obtain an original codeword.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral identifies the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Figure 1:
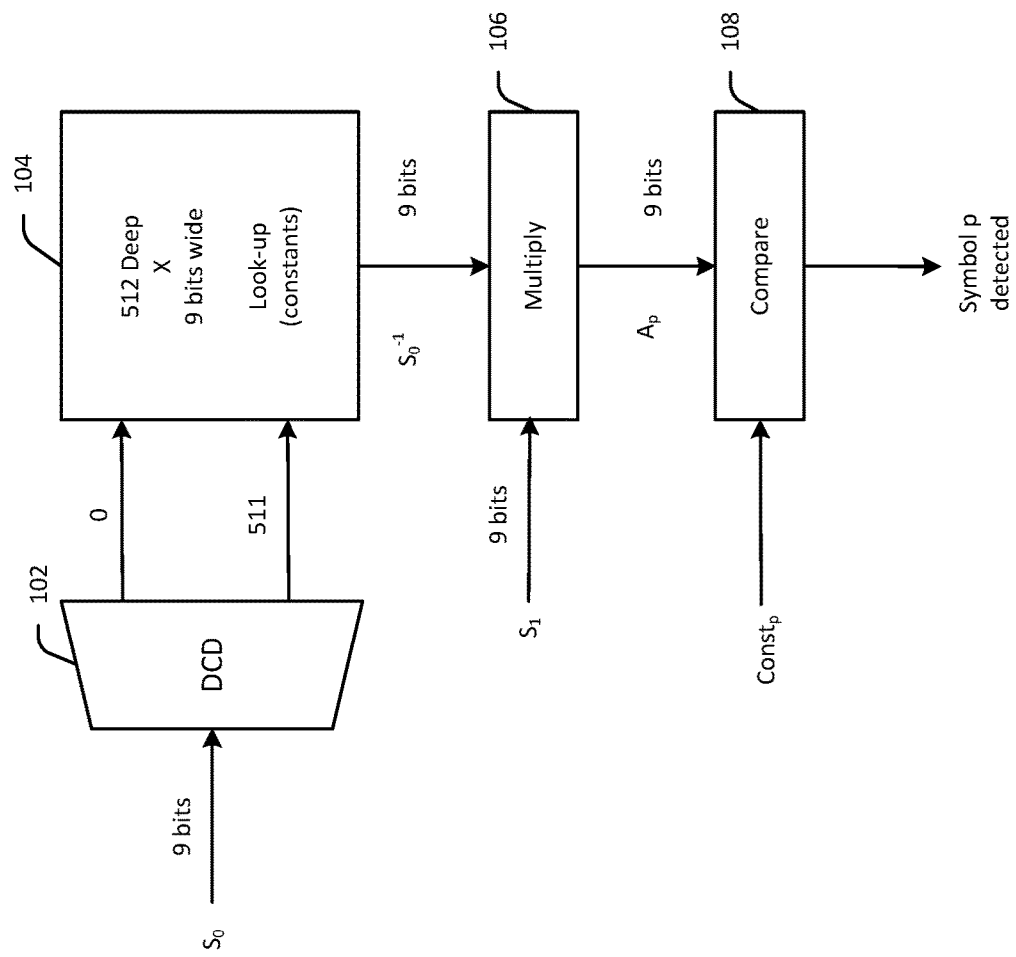
FIG. 1 is a schematic block diagram illustrating a conventional Reed-Solomon decoding process.

Example embodiments of the disclosure include, among other things, systems, methods, computer-readable media, techniques, and methodologies for performing symbol error decoding and correction using an improved reduced latency symbol error correction decoder. In certain example embodiments, the reduced latency symbol error correction decoder may be an improved Reed-Solomon (RS) decoder that utilizes enumerated parallel multiplication in lieu of division and replaces general multiplication with constant multiplication. The use of parallel multiplication in lieu of division can provide reduced latency particularly for small numbers of symbols. Further, replacement of general multiplication with constant multiplication allows for logic reduction and reduced latency. In addition, in certain example embodiments, the reduced symbol error correction decoder can utilize decode term sharing which can yield a significant further reduction in decoder logic and further improvement in latency.

RS codes are a group of error correction codes that belong to the class of non-binary cyclic error correcting codes. RS codes are based on univariate polynomials over finite fields. The class of RS codes may include, for example, single error correction (SEC)/double error detection (DED) codes that are capable of detecting and correcting a single symbol error with one or more bit errors and detecting but not correcting two symbols, each with one or more bit errors. An RS code using n-bit symbols can be defined over a Galois field (GF)($2^n$) with a maximum code length of $2^n-1$ symbols. For example, an RS code using 9-bit symbols can be defined over GF($2^9$) with a maximum code length of $512-1=511$ symbols. Each finite field has a primitive element a whose powers express all non-zero field elements. In particular, each codeword C in a SEC/DED RS code when viewed as a polynomial $C(x)$ satisfies $C(1)=0$; $C(\alpha)=0$; $C(\alpha^2)=0$.

More specifically, each symbol of the codeword C can be viewed as a coefficient of the polynomial $C(x)$. For instance, in example embodiments of the disclosure, a codeword C may include 15 data symbols and 3 check/parity symbols. The polynomial $C(x)$ would then be given as follows: $C(x)=$[symbol 1]+[symbol 2]$x$+[symbol 3]$x^2$+ . . . +[symbol 18]$x^{17}$. A property of RS codes is that there exists values 1, $\alpha$, and $\alpha^2$ that each yield the zero value for the polynomial $C(x)$ assuming that no errors are present in the codeword C. The values of the polynomial $C(x)$ at the values 1, $\alpha$, and $\alpha^2$ may be referred to as syndromes and may be given as follows: $S_0=C(1)$; $S_1=C(\alpha)$; $S_2=C(\alpha^2)$. The syndromes may have the same bit length as the symbols of the codeword C.

When $S_0=S_1=S_2=0$, it is assumed that no errors are present in the codeword C. However, if one or more symbol errors have been introduced to the codeword C, then one or more of the values 1, $\alpha$, or $\alpha^2$ may no longer yield zero values for the polynomial $C(x)$. That is, if R is the sum of the original codeword C and any errors introduced to C during transmission, then one or more of the syndromes $S_1$, $S_2$, or $S_3$ given by $R(1)$, $R(\alpha)$, and $R(\alpha^2)$, respectively, may be non-zero. As a non-limiting example, assume that $S_0=$[000010100]; $S_1=$[101011110]; and $S_2=$[101011011]. If there is one symbol error at position p within the received codeword R with a magnitude $\beta$ then: $S_0=\beta$; $S_1=\beta\alpha^p$; $S_2=\beta\alpha^{2p}$. Thus, for a single symbol error, $S_0$ indicates which bits are in error within the single symbol that is in error. For instance, in this example, $S_0$ indicates that bits 4 and 6 are in error in the symbol that is in error. $S_0$ may be referred to as a bit-flip vector because it indicates which bits need to be flipped in the symbol in error in order to obtain the original data in the codeword C.

While $S_0$ indicates which bits need to be flipped in the single symbol in error, $S_1$ and $S_2$ can be used to determine the position p of that symbol in the received codeword R. As described above, syndrome $S_1$ is the product of the bit-flip vector $S_0$ and the value $\alpha$ raised to the power p, where p indicates the position of the single symbol that is in error. Conventional RS codes operate by first performing a check to determine whether the product of $S_0$ and $S_2$ equals $S_1^2$. If so, it can be determined that a single symbol is in error. Conventional RS codes then divide $S_1$ by $S_0$ to yield $\alpha^p$, which is then compared to each of the powers of $\alpha$ (e.g., $\alpha^0$, $\alpha^1$, . . . , $\alpha^{(\# \ of \ symbols-1)}$) to determine which power of $\alpha$ matches, which in turn, indicates the position p of the single symbol in error. Conventional RS codes may implement the division of $S_1$ by $S_0$ by first performing a lookup of a table of inverses to determine the inverse of $S_0$ ($S_0^{-1}$) and then multiplying $S_1$ by the inverse $S_0^{-1}$.

In contrast, an improved RS code in accordance with example embodiments of the disclosure performs enumerated parallel multiplication in lieu of division. Moreover, the enumerated parallel multiplication involves multiplication with constants (e.g., powers of $\alpha$) in lieu of the general multiplication (e.g., the check as to whether $S_0 S_2=S_1^2$) that is associated with conventional RS codes. Thus, an improved RS code in accordance with example embodiments of the disclosure, achieves a reduction in latency as compared to conventional RS codes by utilizing constant multiplication in lieu of general multiplication. Further, an improved RS code in accordance with example embodiments of the disclosure achieves further reduced latency as compared to conventional RS codes by virtue of performing enumerated parallel multiplication in lieu of division.

More specifically, rather than dividing $S_1$ by $S_0$, an improved RS code in accordance with example embodiments of the disclosure performs a multiplication of $S_0$ with each power of $\alpha$ (e.g., $\alpha^0$, $\alpha^1$, . . . $\alpha^{(\# \ of \ symbols-1)}$) to determine whether any of the resulting products matches $S_1$. In addition, an improved RS code in accordance with example embodiments of the disclosure also performs a multiplication of $S_1$ with each power of $\alpha$ (e.g., $\alpha^0$, $\alpha^1$, $\alpha^{(\# \ of \ symbols-1)}$) to determine whether any of the resulting products matches $S_2$. In certain example embodiments, both of these checks may be performed in parallel. If both of these conditions are met by the same power (p) of $\alpha$, then it can be determined that a single correctable symbol error is present. This enumerated parallel multiplication with constants achieves a latency reduction over the general multiplication and division performed by conventional RS codes.

After performing the enumerated parallel multiplication described above, if there are no matches, it can be determined that there is more than one error in the codeword C. If there is a single match—that is if the product of $S_0$ and $\alpha^p$ matches $S_1$ ($S_0 * \alpha^p = S_1$) for a given p and the product of $S_1$ and $\alpha^p$ matches $S_2$ for the same p ($S_1 * \alpha^p = S_2$)—then it can be determined that there is a single symbol error, and the power of $\alpha$ in the matching products indicates the position of the single symbol in error. If a single error is detected, then $S_0 = \beta$ can be added (XORed) with the symbol in the received codeword R that is at position p to correct the error(s) in that symbol and obtain the original codeword C. In the example introduced above, the bit-flip vector $S_0$ would be XORed with the symbol at position p. On the other hand, if both of these conditions are not met—that is if there is no value of p for which $S_0 * \alpha^p = S_1$ and $S_1 * \alpha^p = S_2$—then multiple symbol errors are present in the received codeword R, and the multiple symbol errors cannot be corrected.

FIG. 1 is a schematic block diagram illustrating a conventional RS decoding process. While FIG. 1 depicts a decoding and look-up process to obtain the inverse $S_0^{-1}$ followed by general multiplication and compare operations, it should be appreciated that conventional RS decoding may instead utilize division (e.g., $S_1/S_0$), which is associated with an even larger latency than multiplication by the inverse. However, even the conventional process depicted in FIG. 1 that utilizes multiplication by the inverse to implement the division is associated with a significantly larger latency than a symbol error correction decoding process in accordance with example embodiments of the disclosure.

For example, assume that we assign latency values to inverse (INV), AND/OR, and XOR operations as follows: INV=0; AND/OR=1, XOR=2. Based on these latency values, the conventional RS decoding process depicted in FIG. 1 would result in 26 latency levels. In particular, the process of FIG. 1 includes a decoding step whereby a decoder (DCD) 102 performs a 9-way AND which is equivalent to an INV and 3 levels of AND operations. This results in a latency value of 3. Then a constant look-up 104 is performed which includes a 256-way OR (8 levels of OR operations) to determine $S_0^{-1}$. This results in a latency value of 8. This is followed by a general multiplication operation 106 that includes an INV, an AND, and 5 levels of XOR operations producing a latency value of 0+1+2(5)=11. Finally, a compare operation 108 is performed which includes an AND and an 8-way OR operation. This is equivalent to an AND and 3 levels of OR operations resulting in a latency value of 1+3=4. Thus, the process depicted in FIG. 1 yields a total latency of 3+8+11+4=26. It should be appreciated that FIG. 1 does not depict the general multiplication step that is performed in conventional RS decoding to determine whether the product of $S_0$ and $S_2$ equals $S_1^2$. However, conventional RS decoders typically perform this step in parallel with the step to determine the inverse $S_0^{-1}$ (or the step to perform the division of $S_0$ by $S_1$ whichever the case may be). Because determining the inverse $S_0^{-1}$ (or performing the division of $S_0$ by $S_1$) has a longer latency than the general multiplication step, it is the limiting step, and the general multiplication does not add to the total latency.

Figure 2:
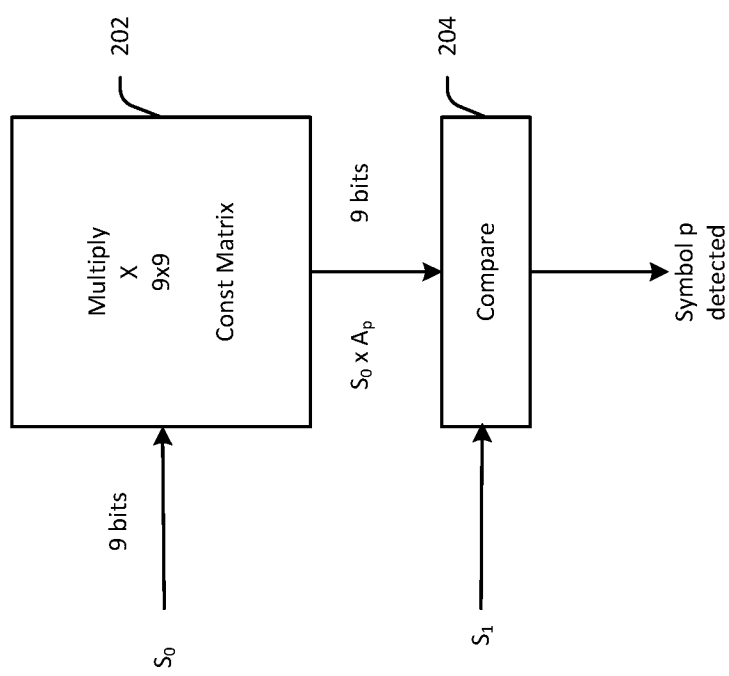
FIG. 2 is a schematic block diagram illustrating a reduced latency error decoding process in accordance with one or more example embodiments of the disclosure.
Figure 4:
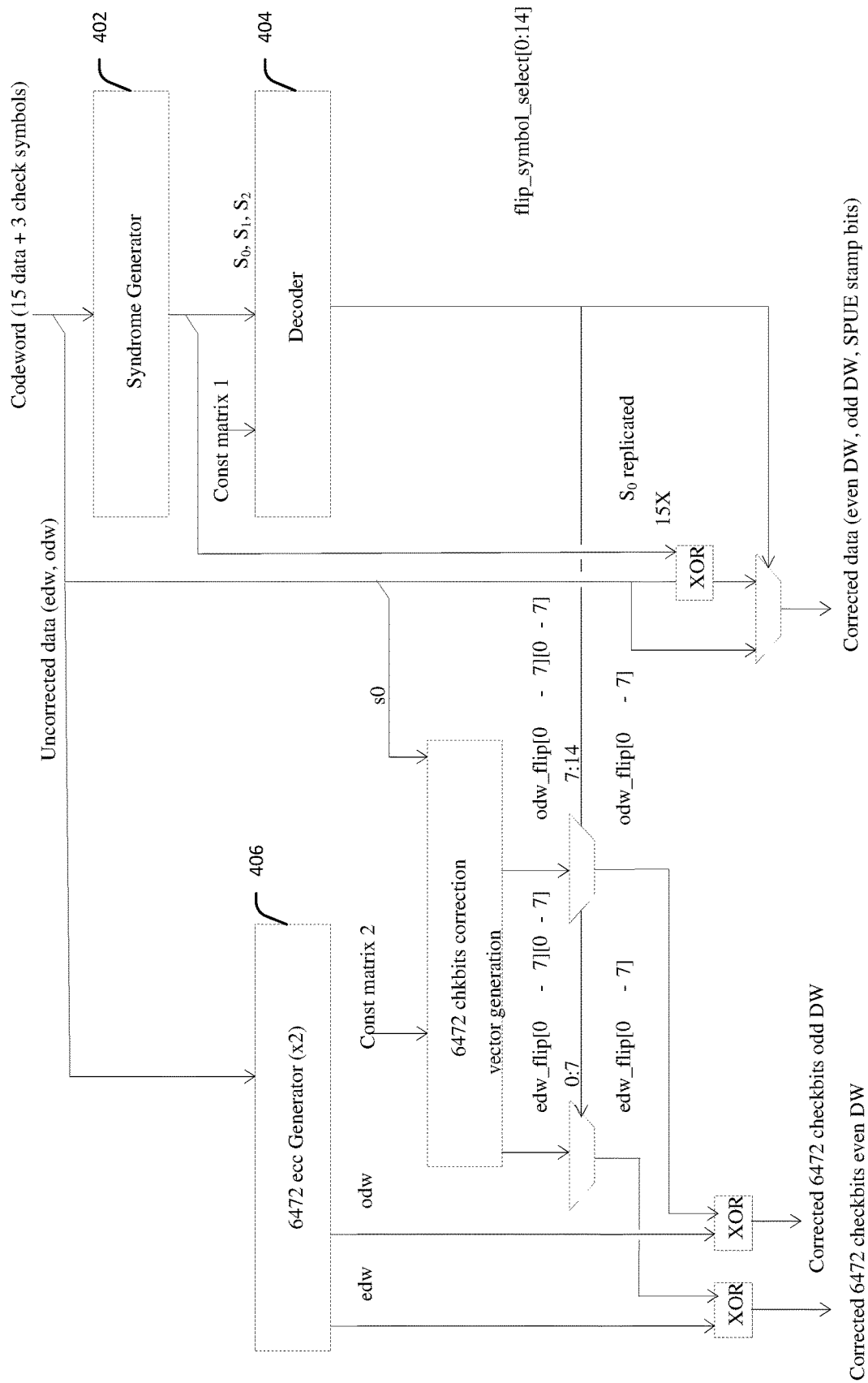
FIG. 4 is a schematic block diagram of components configured to implement a reduced latency error decoding process in accordance with one or more example embodiments of the disclosure.
Figure 7:
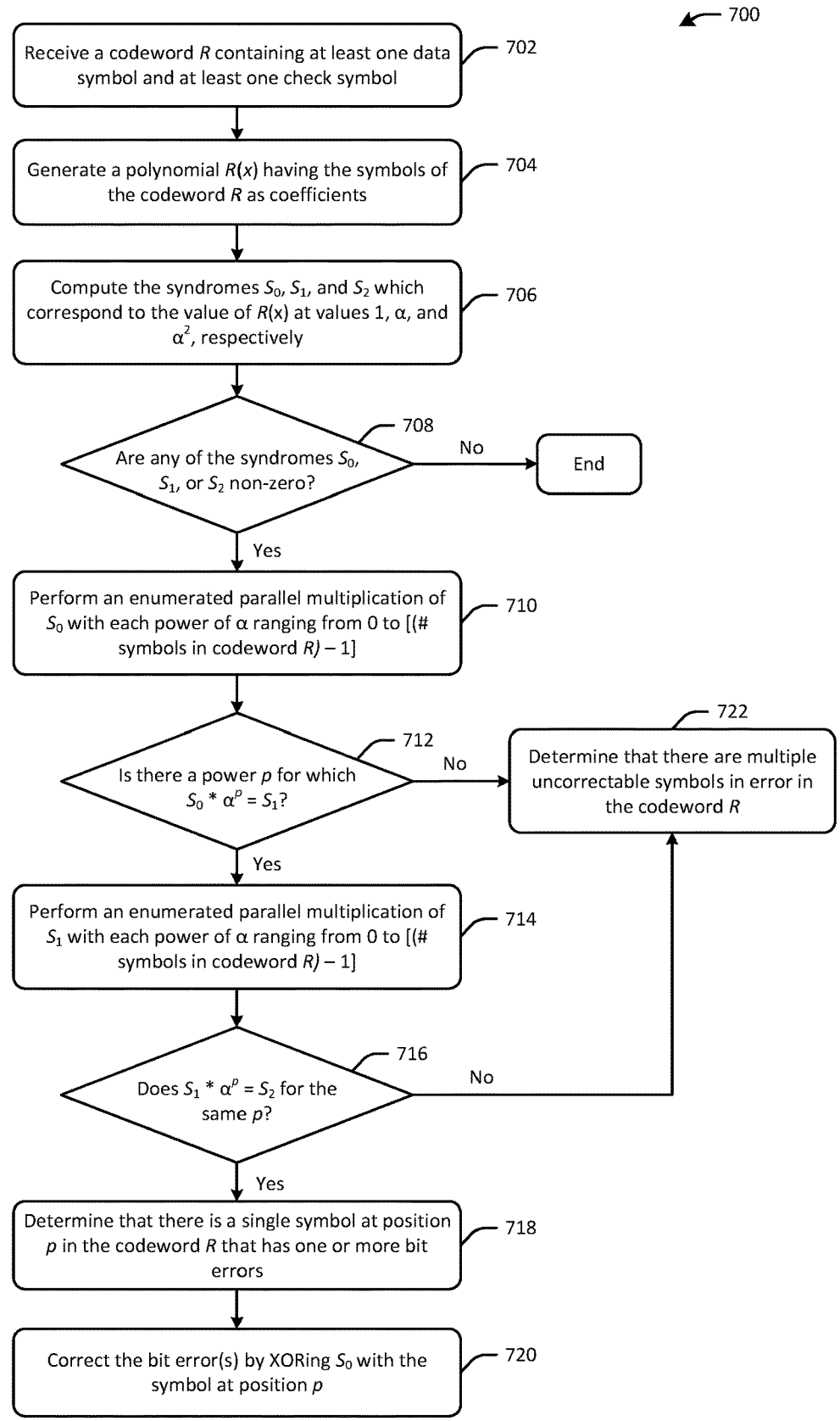
FIG. 7 is a process flow diagram of an illustrative reduced latency error decoding process in accordance with one or more example embodiments of the disclosure.

FIG. 2 is a schematic block diagram illustrating a reduced latency error decoding process in accordance with one or more example embodiments of the disclosure. FIG. 4 is a schematic block diagram of components configured to implement a reduced latency error decoding process in accordance with one or more example embodiments of the disclosure. FIG. 7 is a process flow diagram of an illustrative reduced latency error decoding method 700 in accordance with one or more example embodiments of the disclosure. FIGS. 2, 4, and 7 will be described in conjunction with one another hereinafter.

A reduced latency error decoding process in accordance with example embodiments of the disclosure may rest on the assumptions that an error correcting code is short and that minimizing latency is desirable. In particular, a reduced latency error decoding process in accordance with example embodiments of the disclosure provides ECC protection of a cache design through single-symbol correction/double-symbol detection (SSC/DSD). Moreover, as previously discussed, a reduced latency error decoding process in accordance with example embodiments of the disclosure replaces division with enumerated parallel multiplication and further replaces general multiplication with constant multiplications. In doing so, a reduction in logic and reduced latency over conventional decoding processes is achieved.

Referring first to block 702 of the method 700, a reduced latency error decoding process in accordance with example embodiments of the disclosure may begin with receipt of a codeword R containing at least one data symbol and at least one check symbol. The codeword R may include, for example, 9-bit symbols defined over GF(512). As a non-limiting example, the received codeword R may contain 15 data symbols and 3 check symbols.

At block 704 of the method 700, a polynomial R(x) may be generated that has as its coefficients the symbols of the received codeword R. For instance, in the example introduced above in which R has 15 data symbols and 3 check symbols (and thus 18 total symbols), the polynomial R(x)=[symbol 1]+[symbol 2]x+[symbol 3]$x^2$+ . . . +[symbol 18]$x^{17}$. Then, at block 706 of the method 700, computer-executable instructions of a syndrome generator 402 (FIG. 4) may be executed to compute syndromes $S_0$, $S_1$, and $S_2$ for the polynomial R(x). As previously described, the syndromes $S_0$, $S_1$, and $S_2$ represent the values of the polynomial R(x) at the points 1, $\alpha$, and $\alpha^2$, respectively.

More specifically, referring again to the example introduced earlier, the GF(512) code may be generated over GF(2) by a root of the primitive polynomial $\alpha^9 + \alpha^4 + 1$. The code generator polynomial for this code may be G(x)=(x-1)(x-$\alpha$)(x-$\alpha^2$). If we view the 15 data symbols as the coefficients of a polynomial D(x), then the three check symbols are the coefficients of the remainder after dividing $x^3 D(x)$ by G(x). This may be performed in parallel by an XOR circuit that takes as input the 15 data symbols (9*15=135 bits) and produces 3 check symbols (9*3=27 bits) such that the encoder XOR circuit operates on 135 bits of data and produces 27 check bits. Further, as previously noted, when viewing the 18 symbols in this example as coefficients of the polynomial R(x), the syndromes $S_0$, $S_1$, and $S_2$ are computed by evaluating the polynomial R(x) at the points 1, $\alpha$, and $\alpha^2$, respectively. This may be done in parallel by an XOR circuit which takes 18 received symbols and produces the 3 syndromes.

In particular, a syndrome generator circuit 402 depicted in FIG. 4 may take 18*9=162 bits as input and produce 27 bits as output. In particular, assuming an even 9-bit symbol code, the 27 bits outputted by the syndrome generator circuit 402 may include the parts $S_0$, $S_1$, and $S_2$, each of which is 9 bits in length. $S_0$ may be a 9-bit vector of the error that indicates which bit(s) in the correctable symbol need to be flipped. $S_1$ may be a 9-bit vector pointing to the symbol in error. More specifically, in the example introduced earlier, $S_1$ may be a special encode of which symbol in the 15+3=18 symbols is in error. $S_2$ may be a 9-bit vector to be used as a correctable error (CE)/uncorrectable error (UE) check. For example, if there exists a position p such that $S_1=S_0\alpha^p$ and $S_2=S_1\alpha^p$, then the error is correctable.

In certain example embodiments, the $S_0$ term may be generated for the bit-flip vector to indicate which of the 9 bits in a corrected symbol needs to be corrected. $S_0$ can then be used against all the symbols to pre-correct all symbols (each of which may have a tentative correction). As will be described in more detail hereinafter, secondary tests of $S_0$, $S_1$, and $S_2$ and some constants can then be used to determine which (if any) of the symbols needs correction.

In particular, at block 708 of the method 700, a decoder 404 (FIG. 4) may determine whether any of the syndromes $S_0$, $S_1$, or $S_2$ is non-zero. In response to a negative determination at block 708, which indicates that all syndromes are zero, the method 700 may end because it can be determined that the received codeword R contains no errors. On the other hand, in response to a positive determination at block 708, indicating that one or more of the syndromes $S_0$, $S_1$, and $S_2$ are non-zero, the method 700 may proceed to block 710, where the decoder circuit 404 may perform an enumerated parallel multiplication of $S_0$ with each power of $\alpha$ ranging from 0 to [(# symbols in the codeword R)–1].

At block 712 of the method 700, the decoder circuit 404 may compare the resulting products of the enumerated parallel multiplication performed at block 710 with $S_1$ to determine whether there exists a power p for which $S_1=S_0\alpha^p$. In response to a negative determination at block 712, the method 700 may proceed to block 722, where it may be determined that there are multiple uncorrectable symbol errors in the received codeword R. On the other hand, in response to a positive determination at block 712, the method 700 may proceed to block 714, where the decoder circuit 404 may perform an enumerated parallel multiplication of $S_1$ with each power of $\alpha$ ranging from 0 to [(# symbols in the codeword R)–1].

At block 716 of the method 700, the decoder circuit 404 may compare the resulting products of the enumerated parallel multiplication performed at block 714 with $S_2$ to determine whether $S_2=S_1\alpha^p$ for the same power p for which $S_1=S_0\alpha^p$. In response to a negative determination at block 716, the method 700 may proceed to block 722, where it may be determined that there are multiple uncorrectable symbol errors in the received codeword R. On the other hand, in response to a positive determination at block 716, the decoder circuit 404 may determine, at block 718, that there is a single symbol at position p in the codeword R that has one or more bit errors based on the conditions at block 712 and block 716 both being met. Then, at block 720 of the method 700, the bit error(s) in the single symbol at position p in the received codeword R are corrected by XORing $S_0$ with the symbol at position p.

In certain example embodiments of the disclosure, the enumerated parallel multiplication of $S_0$ with powers of a performed at block 710 and the enumerated parallel multiplication of $S_1$ with powers of a performed at block 714 as well as the checks at blocks 712 and 716 may be performed at least partially in parallel. For instance, in the example introduced earlier in which the codeword R contains 18 total symbols (15 data symbols and 3 check symbols), for each candidate error position p across the range of candidate error positions [0, 17], the check as to whether $S_1=S_0\alpha^p$ and the check as to whether $S_2=S_1\alpha^p$ may be performed in parallel. If a position p is identified that passes both of these checks, then the determination at block 718 may be made, and the data of the symbol in the codeword R at position p may be XORed with $S_0$ to correct the single symbol error.

In particular, if there is only one symbol that is in error, then syndrome $S_0$ is the error value (e.g., the non-zero bits in $S_0$ indicate the bits that need to be flipped in the symbol in error in order to correct the symbol). The reduced latency error decoding process of FIG. 7 seeks to find the location of a single symbol in error within the received codeword R or determine that more than one symbol errors have occurred. If there is a single symbol error at position p in the codeword R, then the syndromes will satisfy the following equations: $S_1=S_0Y$ and $S_2=S_1Y$, where $Y=\alpha^p$ for a particular p across the range of candidate p values (e.g., 0 to 17 in the example introduced earlier). Rather than computing Y by dividing $S_1$ by $S_0$ as conventional RS codes do (which as described earlier results in large latency), a test may be performed in parallel to determine if there is a position p from 0 to 17 such that $S_1=S_0\alpha^p$ and $S_2=S_1\alpha^p$, using 17 pairs of constant multipliers. It should be appreciated that although there are 18 symbols in the codeword R in this example, only 17 pairs of constant multipliers may be needed because when p is 0, $\alpha^p=1$, and thus, $S_1$ can be directly compared to $S_0$ and $S_2$ can be directly compared to $S_1$ without requiring constant multiplications. As such, utilizing this approach without performing any decode term sharing (which will be described in more detail later) may require 34 such constant multipliers. If a position p is identified that satisfies both equations, p indicates the location of the symbol in error in the received codeword R. On the other hand, if no such position p satisfies both equations, more than one symbol error has occurred. Each constant multiplier may be an XOR circuit that takes 9 bits of input and produces 9 bits of output.

More specifically, as shown in FIG. 2, once the 9-bit $S_0$ term is generated at block 706 of the method 700, $S_0$ can be multiplied 202 with a 9×9 constant matrix, for example, to obtain the 9-bit $S_0 \times A_p$. $S_0 \times A_p$ may then be compared 204 with $S_1$. In addition, although not depicted in FIG. 2, a further comparison of $S_1 \times A_p$ to $S_2$ may also be performed. In this manner, which symbol (if any) needs correction may be determined. In particular, the constant matrix $A_p$ may be applied to both $S_0$ and $S_1$ in a constant multiplication operation. Two product vectors of length 18*9 may be produced. These vectors may then be split into 18 successive 9-bit symbols corresponding to the 18 symbols in the codeword R for the example introduced earlier. The products of $S_0 \times A_p$ may be compared with $S_1$ and the products of $S_1 \times A_p$ may be compared with $S_2$. The position of the error whose value is $S_0$ may be identified when both comparisons match for a given pair of product symbols. If there is no position where the products match, then multiple uncorrectable symbol errors are present in the received codeword R.

As previously noted, checking the dual conditions described above may require 34 constant multipliers. The number of constant multipliers needed, however, can be reduced in example embodiments of the disclosure using decode term sharing. In particular, position 0 (which corresponds to raising a to the zero power) is multiplication by 1, and thus, is free. For positions 1 to 8, instead of comparing $S_2$ with $S_1\alpha^p$, $S_2$ can equivalently be compared with $S_0\alpha^{2p}$. However, because the positions 2p for p ranging from 1 to 8 are merely the even positions when p ranges from 1 to 17, those products were already computed for the comparison involving $S_1$. As such, while 17 constant multipliers (positions 1 to 17) may be used to compare with $S_1$, only 9 constant multipliers are needed for computing $S_1\alpha^p$ for p ranging from 9 to 17, giving a total of 17+9=26 constant multipliers to locate the position of the symbol in error. This decode term sharing approach can be used for any reduced latency RS code in accordance with example embodiments of the disclosure to reduce the size of the decoder logic by about 25% over conventional decoding processes assuming that approximately the same number of ones appear in each 9×9 constant matrix.

Stating the above more formally, for a code with length k, computation of $S_0\alpha^p$ and $S_1\alpha^p$ for 0<p<k would require 2k−2 constant multipliers in the absence of decode term sharing. However, if decode term sharing in accordance with example embodiments of the disclosure is used, the check as to whether $S_1=S_0\alpha^p$ for 0<p<k may still be performed, but rather than performing the check as to whether $S_2=S_1\alpha^p$ for 0<p<k, the following check may instead be performed: $S_2=S_0\alpha^{2p}$ for 0<p<k. When 2p<k, the value of $S_0\alpha^{2p}$ has already been computed for the check as to whether $S_1=S_0\alpha^p$ for 0<p<k. As such, while $S_0\alpha^p$ is computed for 0<p<k, $S_0\alpha^{2p}$ only needs to be computed for k≤2p<2k. This requires k−1+(k/2) constant multipliers, which corresponds to about a 25% reduction in the hardware decoder logic needed as compared to conventional decoding processes. In the example introduced earlier in which the codeword R has 18 total symbols, 18−1+(18/2)=26 constant multipliers are needed instead of 2(18)−2=34.

Figure 3A:
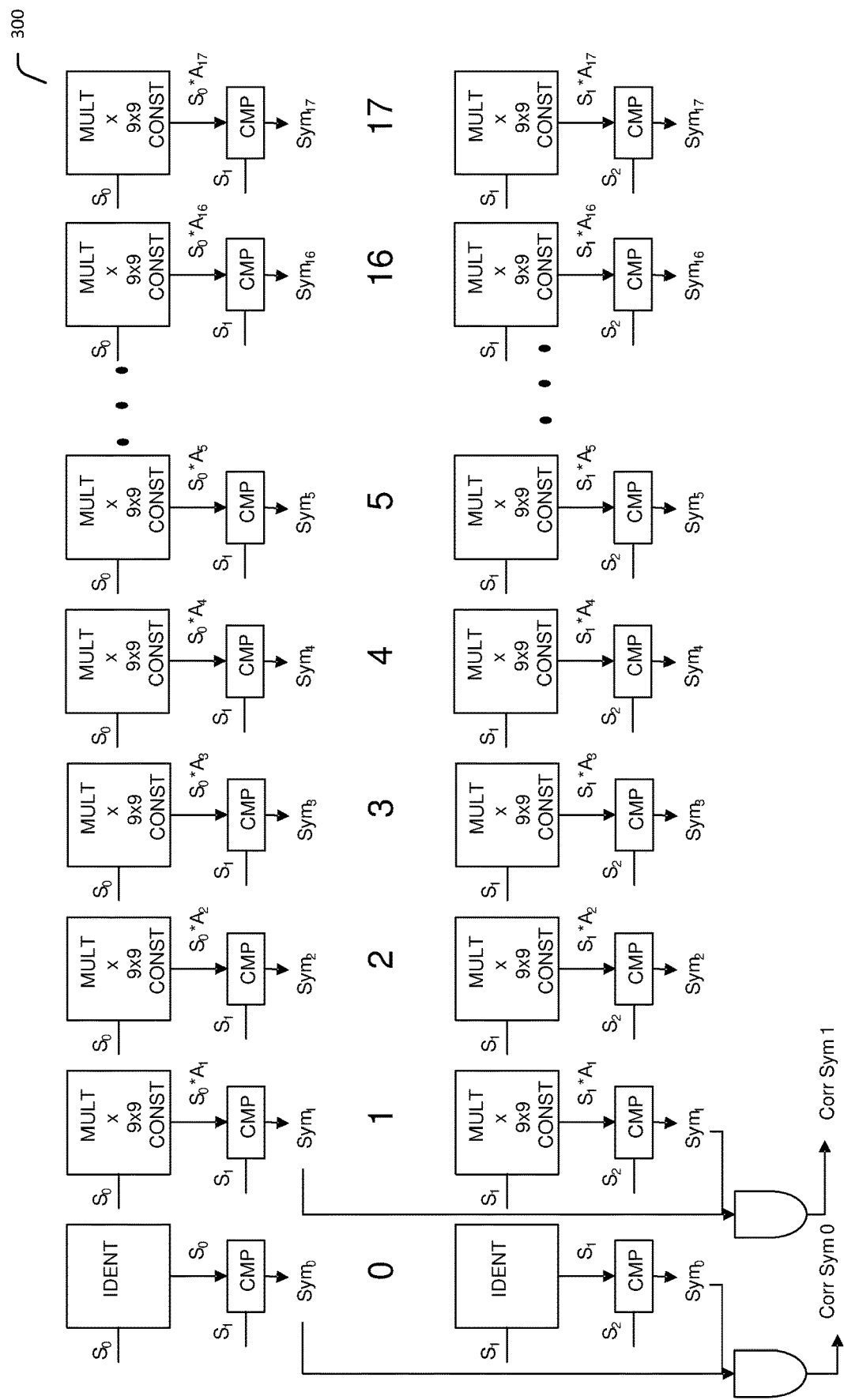
FIG. 3A is a schematic diagram illustrating logic for implementing a reduced latency error decoding process in accordance with one or more example embodiments of the disclosure.
Figure 3B:
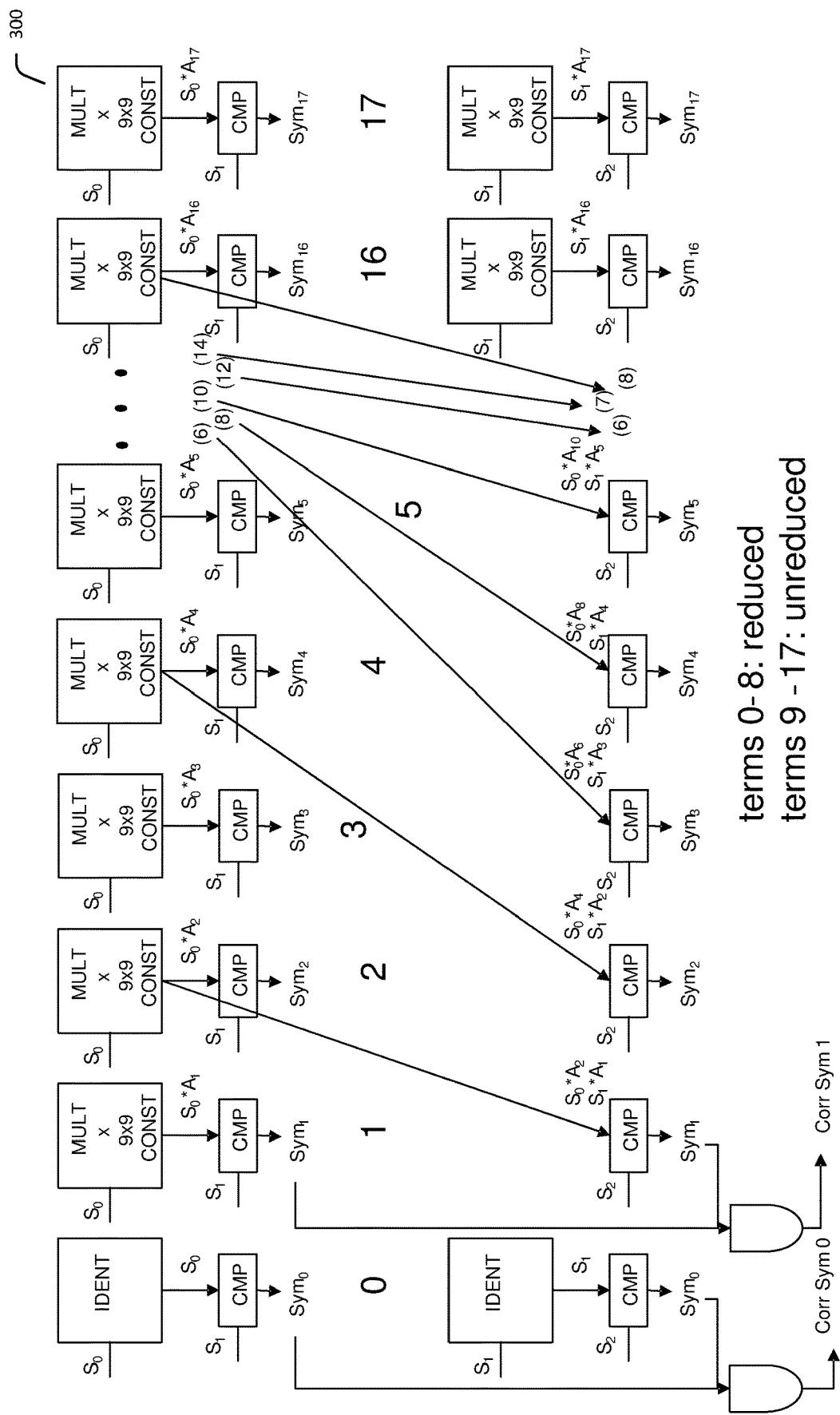
FIG. 3B is an additional schematic diagram illustrating how the logic of FIG. 3A can be used to implement decode term sharing in accordance with one or more example embodiments of the disclosure.

FIG. 3A is a schematic diagram illustrating example decoder logic 300 for implementing a reduced latency error decoding process in accordance with one or more example embodiments of the disclosure. FIG. 3B is an additional schematic diagram illustrating how the logic 300 of FIG. 3A can reuse constant terms through decode term sharing in accordance with one or more example embodiments of the disclosure. As can be seen in FIG. 3B, if S0 is free, S1-S8 can be covered by re-using terms for S2, S4, . . . , S16, which are calculated. This can result in a reduction of 25% of the major XOR logic in the decoder 300, for example.

The logic 300 may include an 18 pack of eDRAMs contained in L3 double data word wrapper outputs, where each eDRAM in the wrapper outputs a 9-bit symbol. The symbol ECC may support correction of any number of corrupted bits within a single symbol and detection of any two simultaneously corrupted symbols. Two doublewords of data are stored in bits 0:127 followed by a 7-bit special uncorrectable error (SPUE) stamp and 3 checkbit symbols in bit positions 135:161. The 7-bit SPUE stamp may be used to record a detected (uncorrectable error) UE or SPUE on store data going into the eDRAMs.

As previously described, a reduced latency error decoding process in accordance with example embodiments of the disclosure may perform the decoding by searching for a position p such that both of the conditions $S_1=S_0\alpha^p$ and $S_2=S_0\alpha^{2p}$ are met. For the shortened code example introduced earlier in which the codeword R has a code length of 18 (e.g., 15 data symbols+3 check symbols) and p ranges from 0 to 17, decode term sharing results in removing 8 constant multipliers of the 34 that otherwise would be required because the calculation of $S_0\alpha^p$ for even values of p correspond to products which can also be used in the $S_2$ comparison.

However, in certain example embodiments, even further logic reduction can be achieved by choosing non-standard code positions for the received codeword R. For instance, with respect to the example shortened RS codeword that includes 18 symbols, it is possible to further reduce the number of constant multipliers that are required from 26 to 18 by choosing a non-standard set of positions for the shortened code. To illustrate how choosing a non-standard set of positions can further reduce the number of required constant multipliers, consider a full-length RS code instead of a shortened one. For a full-length code defined over GF(512), for example, the comparison with respect to the syndrome $S_1$ involves computing $S_0\alpha^p$ for all values of p ranging from 0 to 510, which correspond to all the non-zero elements in the finite field. However, the values of $\alpha^{2p}$ for p ranging from 0 to 510 are simply a permutation of the values of $\alpha^p$. Thus, once the initial products have been computed, no further products need to be computed as long as the elements are properly selected to take advantage of these properties for the shortened RS code.

Referring again to the example shortened RS code containing 18 symbols, instead of using positions 0 to 17, a set of positions may be chosen such that all doubles of positions in the set are also contained in the set. For example, assume that the following set of positions is chosen: {1, 2, 4, 8, 16, 32, 64, 128, 256}. This set contains all doubles of positions in the set. In particular, because the code is defined over GF(512), which has 511 non-zero elements, the chosen positions (which represent exponents of the element α) can be interpreted modulo 511. Thus, 2*256=512 is equivalent to 1 mod 511 and 1 can be interpreted as the double of 256 in modulo 511.

The above-described set of positions has length 9. However, the example shortened RS code containing 18 symbols requires 17 non-zero positions. Accordingly, another set of non-standard positions that contains all doubles of positions in the set must be chosen. Any starting point not contained in the first set may be selected. Because it is desirable to minimize the size of the constant multipliers that are used in addition to the number of constant multipliers that are used, the position 9 may be selected as a starting point for the second set, which yields the set {9, 18, 36, 72, 144, 288, 576=65 mod 511, 130, 260}. It should be appreciated that 2*260=520, which is equal to 9 mod 511, and thus, 9 can be interpreted as the double of 260. Accordingly, this second set of non-standard positions also contains all of its doubles.

It can be shown that since $512=2^9$, a maximal doubling set modulo 511 has a length of 9. Thus, the following 18 positions can be chosen for the RS code: {0, 1, 2, 4, 8, 9, 16, 18, 32, 36, 64, 65, 72, 128, 130, 144, 256, 260}. The corresponding doubles modulo 511 then become: {0, 2, 4, 8, 16, 18, 32, 36, 64, 72, 128, 130, 144, 256, 260, 288, 1, 9}. The only power contained in the doubled set that is not contained in the original set is 288. Thus, the 17 non-zero positions can be selected from the original set along with position 288 from the doubled set to yield 18 constant multipliers. As such, only one additional constant multiplier is needed beyond the 17 non-zero positions in the original set. Accordingly, by selecting a set of non-standard positions that contains all doubles of elements in the set, an even further reduction in the number of constant multipliers from 26 to 18 can be achieved.

When considering the latency associated with a decoding process according to example embodiments of the disclosure, it be can be seen that the latency is significantly lower than with conventional decoding processes. In particular, assuming the same latency value assignments as mentioned earlier are applied, multiplication of $S_0$ with the constant matrix $A_p$ includes 3 levels of XOR operations. This results in a latency value of 3(2)=6. The compare operation 204 includes both a pattern compare and a final compare. The pattern compare includes 1 XOR and a 9-way OR which is equivalent to 1 XOR and 3 OR operations. This results in a latency value of 2+3(1)=5. The final compare is a single AND operation resulting in a latency value of 1. Thus, the total latency associated with the decoding process of FIGS. 2 and 7 according to example embodiments of the disclosure is 6+5+1=12, which is significantly lower than the latency of 24 associated with the conventional decoding process depicted in FIG. 1. In other example embodiments of the disclosure, the compare operation may include an AND operation and an 8-way OR which is equivalent to an AND operation and 3 OR operations, producing a latency value of 4 rather than the 6 described above.

To further illustrate this significant reduction in latency achieved by example embodiments of the disclosure, consider the latency value of 22 associated the decoding step, the constant look-up 104, and the general multiplication operation 106 of FIG. 1. In a decoding process, according to example embodiments of the disclosure, these steps are replaced with the constant multiplication operation $S_0 \times A_p$ which has a latency of 6 due to the 3 levels of XOR operations. For instance, assume that we have a constant 9×9 matrix with the following rows: 011000010; 001100001; 000110000; 100011000; 001001110; 000100111; 000010011; 100001001; and 110000100. These matrix rows are associated with the following XOR operations: row 1: 3+1=4-way; row 2: 3+1=4-way; row 3: 2+1=3-way; row 4: 3+1=4-way; row 5: 4+1=5-way; row 6: 4+1=5-way; row 7: 3+1=4-way; row 8: 3+1=4-way; row 9: 3+1=4-way. Thus, the multiplication area contains 28 XORs but only 3 levels of XOR (5-way XOR max). The 3 levels of XOR result in a latency of 3(2)=6.

As explained above, the use of constants for multiplication rather than strictly data/XORs results in reduced latency. In addition, multiplication of a syndrome by a constant followed by a compare operation in lieu of a divide circuit also yields a reduction in latency. If a match is detected from the compare, the divide circuit (if used) would have yielded that value. Less circuitry is needed for the constant multiplication and compare than would be required with a divide circuit. In addition, decode term sharing can further improve latency.

An example matrix for checkbit generation is shown below. Assuming eighteen 9-bit input symbols, the matrix for checkbit generation along with the corresponding bit positions may be given by the following table. The first column is the output (27 bits, 3 symbols×9 used for checkbits) which are numbered 0 to 26 vertically within the first column. In the Hmatrix, a zero (0) means that bit is NOT part of the calculation and a one (1) means the particular input is part of the calculation of that checkbit. By example, the first column (0) is for checkbit 0, which is generated by the XOR of Inputs 1, 4, 5, 10, 11, 12, 14, 15, 16, 19, 20, 21, 22, 23, 24, 25, 26, 30, 31, 32, 33, 35, 39, 41, 42, 43, 45, 46, 48, 49, 50, 52, 53, 56, 58, 60, 61, 63, 64, 66, 68, 71, 72, 73, 76, 78, 81, 82, 84, 85, 86, 88, 93, 98, 99, 100, 101, 104, 105, 106, 107, 108, 111, 112, 117, 122, 123, 125, 126, 133, and 134. Another way of viewing this is that input bit 0 (as shown in row 0) will be used to calculate checkbits 3, 4, 5, 8, 10, 11, 12, 13, 15, 16, 17, 18, 19, 20, 23, 24, and 25. Likewise, the other twenty-six outputs/checkbits can be generated from the inputs based on the table.

| OUTPUT/Checkbits 012345678901234567890123456 | INPUT |
|---|---|
| 000111001011110111111001110 | 0 |
| 100001100101101011011100111 | 1 |
| 010000110110100101101100011 | 2 |
| 001000011111000010101100001 | 3 |
| 100110001011100001111000000 | 4 |
| 110001000101100000111100000 | 5 |
| 011000100010110000011110000 | 6 |
| 001100010001011000000111000 | 7 |
| 000110001000101100000011100 | 8 |
| 010010111001001000111011111 | 9 |
| 101011011000100100111111111 | 10 |
| 110111101000010010111101111 | 11 |
| 111001110000001001111100111 | 12 |
| 011100111100010100111100011 | 13 |
| 101100011010001010111100001 | 14 |
| 110100001001000101111100000 | 15 |
| 111000000100110100111110000 | 16 |
| 011100000010011001111000 | 17 |
| 000011110000010001000010111 | 18 |
| 100011110000001001100011011 | 19 |
| 110011111000000010111011101 | 20 |
| 111011111000000001111111110 | 21 |
| 111111111100010000111111111 | 22 |
| 111101111010001000101101111 | 23 |
| 111100111001000100110100111 | 24 |
| 111100011000100010111000011 | 25 |
| 111100001000010001111110001 | 26 |
| 000111100000110010100001110 | 27 |
| 000011110000011001010000111 | 28 |
| 000001111100011000101010011 | 29 |
| 100010111010001110110111001 | 30 |
| 110011011001000111111001100 | 31 |
| 111011101100110011011100110 | 32 |
| 111111110110000100011100011 | 33 |
| 011111111111010100100101001 | 34 |
| 101101111011101010110000100 | 35 |
| 011110100010001111101111011 | 36 |
| 001111010101010111110101101 | 37 |
| 000111011101101111111000110 | 38 |
| 100001110111001101011100011 | 39 |
| 010000111111110110101100001 | 40 |
| 101010011011111011110100000 | 41 |
| 110111001101101010110110000 | 42 |
| 111001100110100110001101000 | 43 |
| 011100110011010011000110100 | 44 |
| 101111101011110000010001101 | 45 |
| 110101110001111000101010110 | 46 |
| 011010111000111000010101011 | 47 |
| 101111011000011110101000101 | 48 |
| 110101101000000111111011010 | 49 |
| 111000110100001011110110011 | 50 |
| 011100011100110110110111100 | 51 |
| 101100001111011101010111110 | 52 |
| 110100000111111110001011111 | 53 |
| 000101010100101100001110010 | 54 |
| 000010101000101100010111001 | 55 |
| 100011010000010110101001100 | 56 |
| 010001101000001011010100110 | 57 |
| 101010110100001010010100011 | 58 |
| 010101011100110110100111001 | 59 |
| 101000101011001101110001100 | 60 |
| 110110010101110110011000110 | 61 |
| 011011001010111011001100011 | 62 |
| 100110101001010000001100101 | 63 |
| 110001010000101000100100010 | 64 |
| 011000101000010100010010001 | 65 |
| 101110010000000101010101000 | 66 |
| 010111001000000101010101100 | 67 |
| 101001100100010100010110 | 68 |
| 010100110010001001000101011 | 69 |
| 001010011101010100100000101 | 70 |
| 100110010101010101010010010 | 71 |
| 100001001101100010101101011 | 72 |
| 110010100010110001110100101 | 73 |
| 011001010101001000111000010 | 74 |
| 001100101010100100011100001 | 75 |
| 100100010010010010101100000 | 76 |
| 010010001000101001010110000 | 77 |
| 101011000100000100001011000 | 78 |
| 010101100010000100001011000 | 79 |
| 001010110001000001000010110 | 80 |
| 111111101111101101100010000 | 81 |
| 111101110111100110010001000 | 82 |

-continued

| OUTPUT/Checkbits<br>0123456789012345678 90123456 | INPUT |
|---|---|
| 0111101110111001100 1000100 | 83 |
| 1011010111011010010 00100010 | 84 |
| 1101001011101001000 00010001 | 85 |
| 1110000100110100101 00011000 | 86 |
| 0111000010011010010 10001100 | 87 |
| 1011000001001001000 01000110 | 88 |
| 0101100000100100100 00100011 | 89 |
| 0000000100111111010 01111110 | 90 |
| 0000000100111111010 01111111 | 91 |
| 0000000011011011101 00101111 | 92 |
| 1000100000101101111 10000111 | 93 |
| 0100010001010010111 11010011 | 94 |
| 0010001001101101011 11111001 | 95 |
| 0001000101110010101 11101100 | 96 |
| 0000100010111001010 11110110 | 97 |
| 1000110001011001000 11111011 | 98 |
| 1100100111011001010 0100001 | 99 |
| 1110110010110110011 00000000 | 100 |
| 1111111001011110001 1000000 | 101 |
| 0111111100101111000 1100000 | 102 |
| 0011111110010111100 0110000 | 103 |
| 1001011111001111110 00011000 | 104 |
| 1100011111100011110 00001100 | 105 |
| 1110100111110101110 00000110 | 106 |
| 1111110011111110110 00000011 | 107 |
| 1100011000101110100 00110110 | 108 |
| 0110011000101110100 01000011011 | 109 |
| 0011000111001111101 00011101 | 110 |
| 1001000010100111111 00011110 | 111 |
| 1100000001010111110 11001111 | 112 |
| 0110000001101111111 01110111 | 113 |
| 0011000001110011111 10101011 | 114 |
| 0001100001111011111 1000101 | 115 |
| 0000110001111010111 11110010 | 116 |
| 1101100000100010000 00111000 | 117 |
| 0110110000010001000 00011100 | 118 |
| 0011011000001000100 0001110 | 119 |
| 0001101100000100010 00000111 | 120 |
| 0000110111000110001 0001011 | 121 |
| 1000110101000110011 00011001 | 122 |
| 1100111100010001101 11011100 | 123 |
| 0110011100010001101 11011100 | 124 |
| 1011110111100000000 1001110111 | 125 |
| 1110000000111000000 0000100000 | 126 |
| 0111000000001110000 000010000 | 127 |
| 0011100000000111000 0000010000 | 128 |
| 0001110000000011100 000000100 | 129 |
| 0000111000000001110 000000010 | 130 |
| 0000011100000000111 000000001 | 131 |
| 0000001111000100111 00010000 | 132 |
| 1000100111100110010 10001000 | 133 |
| 1100110011110111000 01000100 | 134 |

At times, it may be necessary to convert from one form of ECC to another. For instance, while example embodiments described herein may be low latency for a cache design, the latency may be too high for some bus transfers or faster cache levels, which may have, for example, Hamming codes for just single-bit correction/double-bit detection. Various techniques may be used to convert from one ECC code to another, while still protecting the data. One such approach is to generate parity on the data after it is corrected/processed by one code and before it is encoded into a second code. Another technique is ECC conversion as described hereinafter that achieves a lower latency by correcting one code while initiating generation of a second code in parallel. Referring again to FIG. 4, an ECC generator 406 is depicted that may perform checkbit generation on the raw data into a second ECC code (for instance a Hamming code) while, in parallel, correction vectors may be generated based on multiplying $S_0$ by another constant matrix. This constant matrix may be based on taking the 9-bit segments of the ECC matrix for the code being converted to (the 6472 code) that are equivalent to the 9-bit symbols distributed in the 9-bit symbol code. $S_0$ is multiplied against these segments of the matrix to generate, in parallel, those ECC bits that would need to be flipped for each 9-bit symbol that potentially could contain an error. Once the symbol to be corrected is identified, late selects may occur on both the data and the 6472 check bits to generate both corrected data and checkbits.

Figure 5:
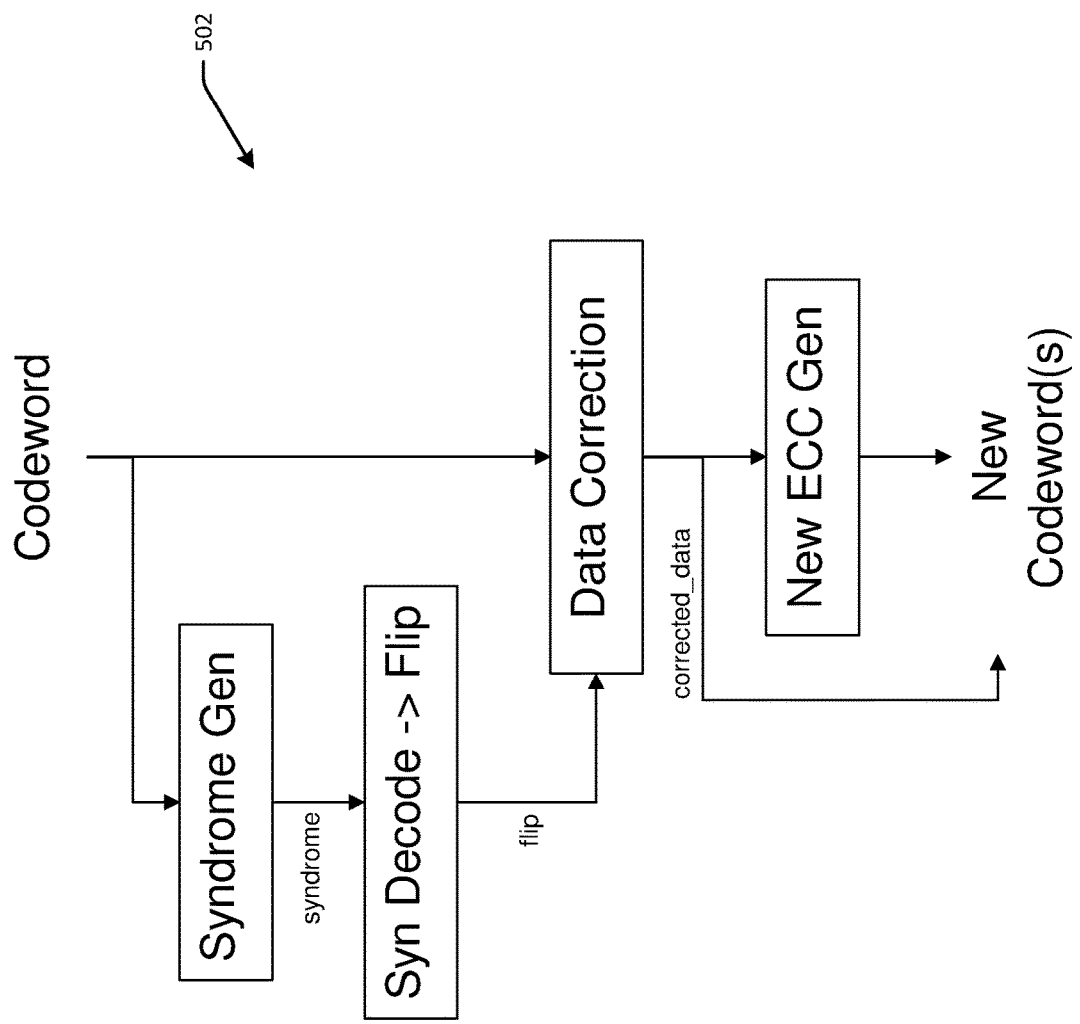
FIG. 5 is a schematic block diagram illustrating an example L4 cache organization in accordance with one or more example embodiments of the disclosure.
Figure 6:
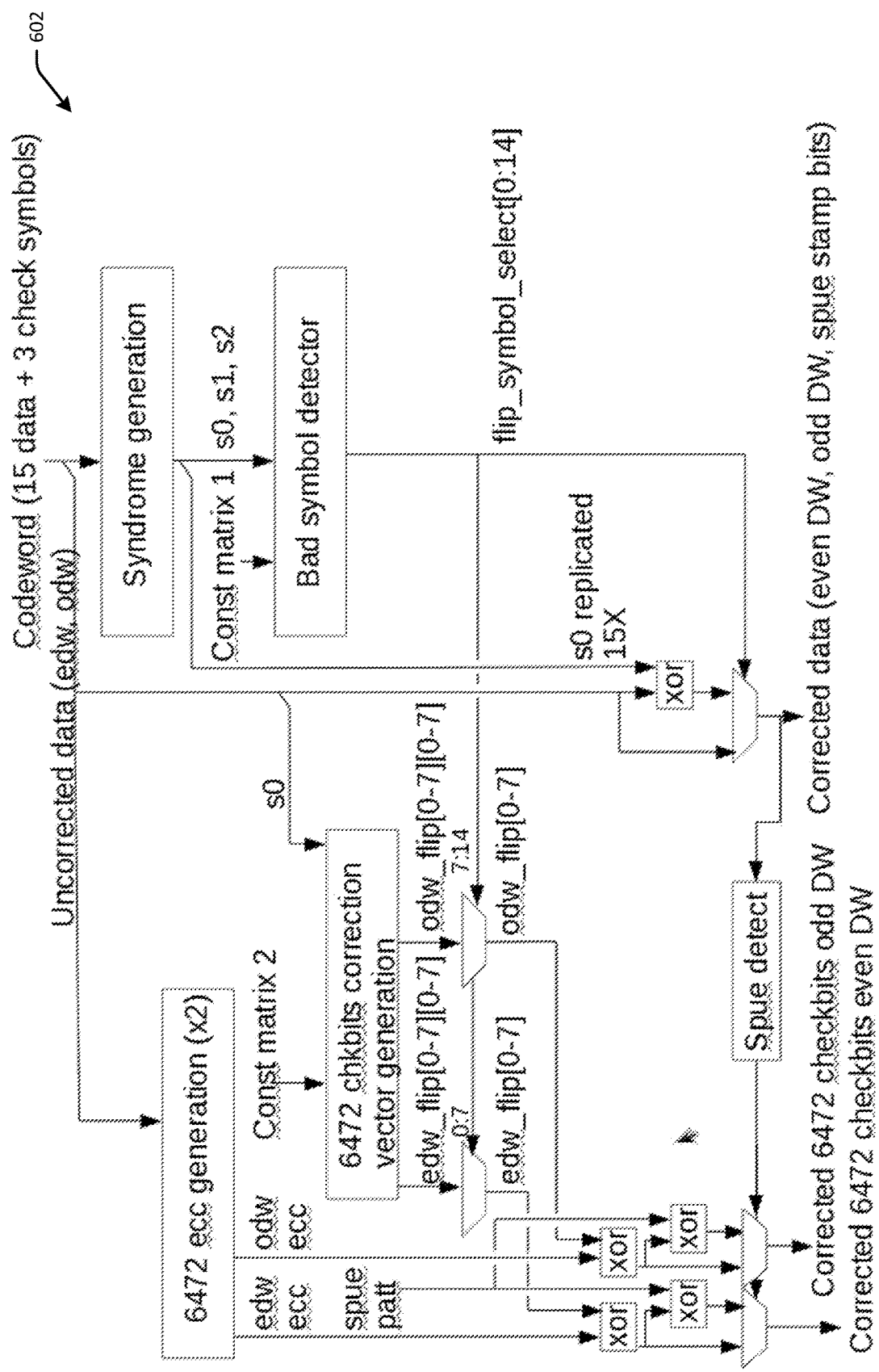
FIG. 6 is a schematic block diagram illustrating an example L3 cache organization in accordance with one or more example embodiments of the disclosure.

FIG. 5 is a schematic block diagram illustrating an example error correction flow 502 in accordance with one or more example embodiments of the disclosure. The error correction flow 502 includes syndrome generation from a codeword, error decoding using the generated syndromes, and application of the correction to the data of the received codeword. Any new error correction code would then be generated off the corrected data. The "syn decode->flip" block in FIG. 5 may include the same functionality as the decoder 404 depicted in FIG. 4. FIG. 6 is a schematic block diagram illustrating an example error correction flow 602 in accordance with one or more example embodiments of the disclosure. The example error correction flows 502 and 602 shown respectively in FIGS. 5 and 6 may be implemented using the example decoder logic of FIGS. 3 and 4, for example.

One or more operations of a reduced latency error decoding process in accordance with example embodiments of the disclosure may be performed, at least in part, by one or more of program modules configured to implement underlying hardware logic. These program modules may be implemented in any combination of hardware, software, and/or firmware. In certain example embodiments, one or more of these program modules may be implemented, at least in part, as software and/or firmware modules that include computer-executable instructions that when executed by a processing circuit cause one or more operations to be performed. A system or device described herein as being configured to implement example embodiments of the disclosure may include one or more processing circuits, each of which may include one or more processing units or nodes. Computer-executable instructions may include computer-executable program code that when executed by a processing unit may cause input data contained in or referenced by the computer-executable program code to be accessed and processed to yield output data.

One or more illustrative embodiments of the disclosure are described herein. Such embodiments are merely illustrative of the scope of this disclosure and are not intended to be limiting in any way. Accordingly, variations, modifications, and equivalents of embodiments disclosed herein are also within the scope of this disclosure.

Figure 8:
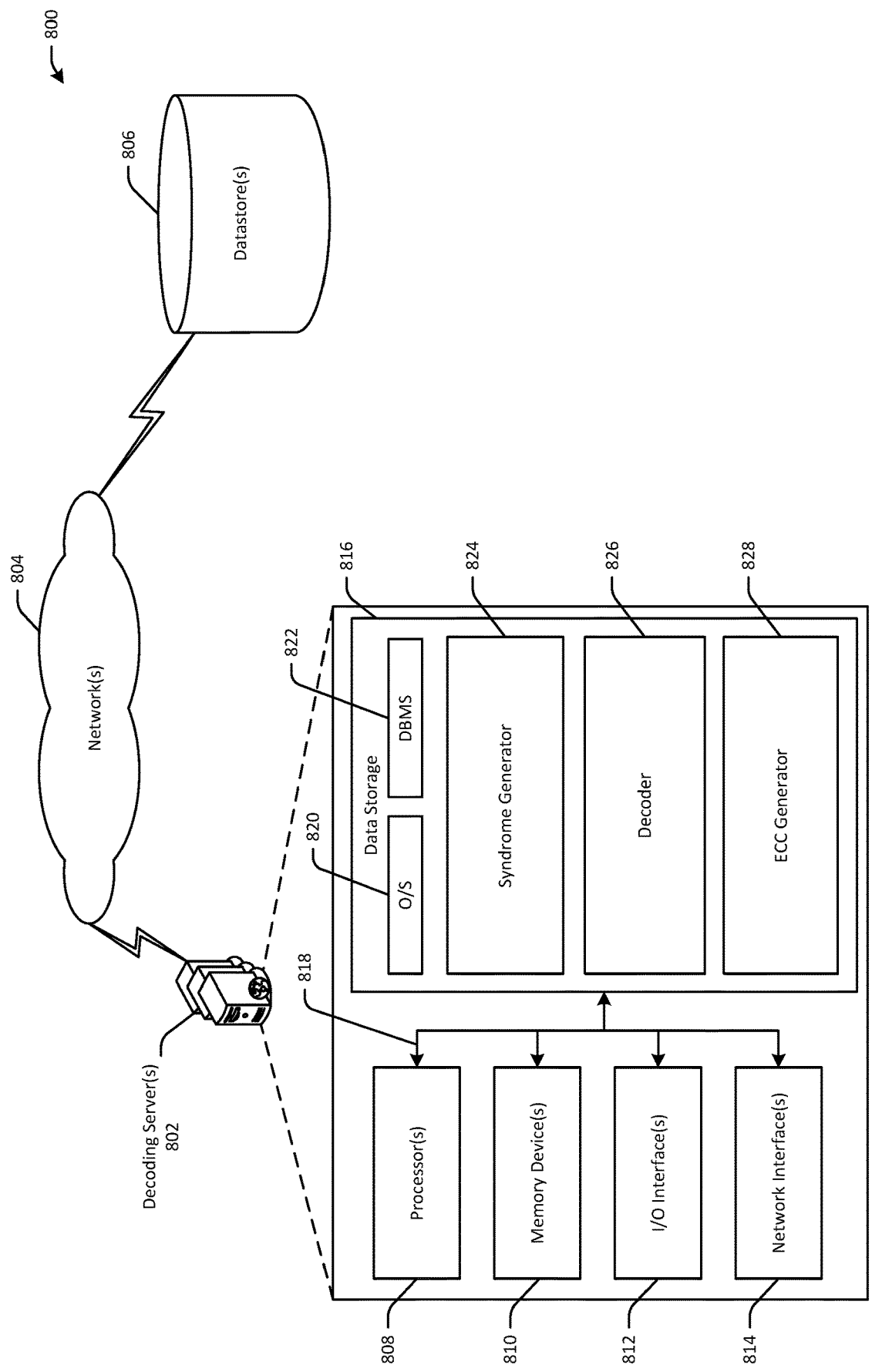
FIG. 8 is a schematic diagram of an illustrative networked architecture configured to implement one or more example embodiments of the disclosure.

FIG. 8 is a schematic diagram of an illustrative networked architecture 800 configured to implement one or more example embodiments of the disclosure. The architecture may include one or more decoding servers 802, one or more networks 804, and one or more datastores, potentially accessible by the decoding server(s) 802 directly or over one or more of the network(s) 804. While the decoding server(s) 802 may be described herein in the singular, it should be appreciated that multiple instances of the decoding server 802 may be provided, and functionality described in connection with the decoding server 802 may be distributed across such multiple instances.

In an illustrative configuration, the decoding server 802 may include one or more processors (processor(s)) 808, one or more memory devices 810 (generically referred to herein as memory 810), one or more input/output ("I/O")

interface(s) 812, one or more network interfaces 814, and data storage 816. The decoding server 802 may further include one or more buses 818 that functionally couple various components of the decoding server 802.

The bus(es) 818 may include at least one of a system bus, a memory bus, an address bus, or a message bus, and may permit the exchange of information (e.g., data (including computer-executable code), signaling, etc.) between various components of the decoding server 802. The bus(es) 818 may include, without limitation, a memory bus or a memory controller, a peripheral bus, an accelerated graphics port, and so forth. The bus(es) 818 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

The memory 810 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 810 may include multiple different types of memory such as various types of static random access memory (SRAM), various types of dynamic random access memory (DRAM), embedded DRAM (eDRAM), various types of unalterable ROM, and/or writeable variants of ROM such as electrically erasable programmable read-only memory (EEPROM), flash memory, and so forth. The memory 810 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 816 may include removable storage and/or non-removable storage including, but not limited to, magnetic storage, optical disk storage, and/or tape storage. The data storage 816 may provide non-volatile storage of computer-executable instructions and other data. The memory 810 and the data storage 816, removable and/or non-removable, are examples of computer-readable storage media (CRSM) as that term is used herein.

The data storage 816 may store computer-executable code, instructions, or the like that may be loadable into the memory 810 and executable by the processor(s) 808 to cause the processor(s) 808 to perform or initiate various operations. The data storage 816 may additionally store data that may be copied to memory 810 for use by the processor(s) 808 during the execution of the computer-executable instructions. Moreover, output data generated as a result of execution of the computer-executable instructions by the processor(s) 808 may be stored initially in memory 810 and may ultimately be copied to data storage 816 for non-volatile storage.

More specifically, the data storage 816 may store one or more operating systems (O/S) 820; one or more database management systems (DBMS) 822 configured to access the memory 810 and/or one or more external data store(s) 806; and one or more program modules, applications, engines, computer-executable code, scripts, or the like such as, for example, a syndrome generator 824, a decoder 826, and an ECC generator 828. Any of the components depicted as being stored in data storage 816 may include any combination of software, firmware, and/or hardware. The software and/or firmware may include computer-executable instructions (e.g., computer-executable program code) that may be loaded into the memory 810 for execution by one or more of the processor(s) 808 to perform any of the operations described earlier in connection with correspondingly named components.

Although not depicted in FIG. 8, the data storage 816 may further store various types of data utilized by components of the decoding server 802 (e.g., input message data, pointer data, output data from the processing of input message blocks of an input message, padding signature data, message digest data, etc.). Any data stored in the data storage 816 may be loaded into the memory 810 for use by the processor(s) 808 in executing computer-executable instructions. In addition, any data stored in the data storage 816 may potentially be stored in the external data store(s) 806 and may be accessed via the DBMS 822 and loaded in the memory 810 for use by the processor(s) 808 in executing computer-executable instructions.

The processor(s) 808 may be configured to access the memory 810 and execute computer-executable instructions loaded therein. For example, the processor(s) 808 may be configured to execute computer-executable instructions of the various program modules, applications, engines, or the like of the decoding server 802 to cause or facilitate various operations to be performed in accordance with one or more embodiments of the disclosure. The processor(s) 808 may include any suitable processing unit capable of accepting data as input, processing the input data in accordance with stored computer-executable instructions, and generating output data. The processor(s) 808 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 808 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 808 may be capable of supporting any of a variety of instruction sets.

Referring now to other illustrative components depicted as being stored in the data storage 816, the O/S 820 may be loaded from the data storage 816 into the memory 810 and may provide an interface between other application software executing on the decoding server 802 and hardware resources of the decoding server 802. More specifically, the O/S 820 may include a set of computer-executable instructions for managing hardware resources of the decoding server 802 and for providing common services to other application programs. In certain example embodiments, the O/S 820 may include or otherwise control execution of one or more of the program modules depicted as being stored in the data storage 816. The O/S 820 may include any operating system now known or which may be developed in the future including, but not limited to, any server operating system, any mainframe operating system, or any other proprietary or non-proprietary operating system.

The DBMS 822 may be loaded into the memory 810 and may support functionality for accessing, retrieving, storing, and/or manipulating data stored in the memory 810, data stored in the data storage 816, and/or data stored in the external data store(s) 806. The DBMS 822 may use any of a variety of database models (e.g., relational model, object model, etc.) and may support any of a variety of query languages. The DBMS 822 may access data represented in one or more data schemas and stored in any suitable data repository. External data store(s) 806 that may be accessible by the decoding server 802 via the DBMS 822 may include, but are not limited to, databases (e.g., relational, object-oriented, etc.), file systems, flat files, distributed datastores in which data is stored on more than one node of a computer network, peer-to-peer network datastores, or the like.

Referring now to other illustrative components of the decoding server 802, the input/output (I/O) interface(s) 812 may facilitate the receipt of input information by the decoding server 802 from one or more I/O devices as well as the output of information from the decoding server 802 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the decoding server 802 or may be separate. The I/O devices may further include, for example, any number of peripheral devices such as data storage devices, printing devices, and so forth.

The I/O interface(s) 812 may also include an interface for an external peripheral device connection such as universal serial bus (USB), FireWire, Thunderbolt, Ethernet port or other connection protocol that may connect to one or more networks. The I/O interface(s) 812 may also include a connection to one or more antennas to connect to one or more networks via a wireless local area network (WLAN) (such as Wi-Fi) radio, Bluetooth, and/or a wireless network radio, such as a radio capable of communication with a wireless communication network such as a Long Term Evolution (LTE) network, WiMAX network, 3G network, etc.

The decoding server 802 may further include one or more network interfaces 814 via which the decoding server 802 may communicate with any of a variety of other systems, platforms, networks, devices, and so forth. The network interface(s) 814 may enable communication, for example, with one or more other devices via one or more of the network(s) 804. The network(s) 804 may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. The network(s) 804 may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

It should be appreciated that the program modules depicted in FIG. 8 as being stored in the data storage 816 are merely illustrative and not exhaustive and that processing described as being supported by any particular module may alternatively be distributed across multiple modules, engines, or the like, or performed by a different module, engine, or the like. In addition, various program module(s), script(s), plug-in(s), Application Programming Interface(s) (API(s)), or any other suitable computer-executable code hosted locally on the decoding server 802 and/or hosted on other computing device(s) accessible via one or more networks, may be provided to support functionality provided by the modules depicted in FIG. 8 and/or additional or alternate functionality. Further, functionality may be modularized in any suitable manner such that processing described as being performed by a particular module may be performed by a collection of any number of program modules, or functionality described as being supported by any particular module may be supported, at least in part, by another module. In addition, program modules that support the functionality described herein may be executable across any number of servers 802 in accordance with any suitable computing model such as, for example, a client-server model, a peer-to-peer model, and so forth. In addition, any of the functionality described as being supported by any of the modules depicted in FIG. 8 may be implemented, at least partially, in hardware and/or firmware across any number of devices.

It should further be appreciated that the decoding server 802 may include alternate and/or additional hardware, software, or firmware components beyond those described or depicted without departing from the scope of the disclosure. More particularly, it should be appreciated that software, firmware, or hardware components depicted as forming part of the decoding server 802 are merely illustrative and that some components may not be present or additional components may be provided in various embodiments. While various illustrative modules have been depicted and described as software modules stored in data storage 816, it should be appreciated that functionality described as being supported by the modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional program modules and/or engines not depicted may be present and may support at least a portion of the described functionality and/or additional functionality.

A decoding process in accordance with example embodiments of the disclosure may be performed by a decoding server 802 having the illustrative configuration depicted in FIG. 8, or more specifically, by hardware logic, hardware devices, program modules, engines, applications, or the like executable on such a device. It should be appreciated, however, that such operations may be implemented in connection with numerous other device configurations.

Any operations described herein may be carried out or performed in any suitable order as desired in various example embodiments of the disclosure. Additionally, in certain example embodiments, at least a portion of the operations may be carried out in parallel. Furthermore, in certain example embodiments, less, more, or different operations than those described may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular system, system component, device, or device component may be performed by any other system, device, or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure. In addition, it should be appreciated that any operation, element, component, data, or the like described herein as being based on another operation, element, component, data, or the like may be additionally based on one or more other operations, elements, components, data, or the like. Accordingly, the phrase "based on," or variants thereof, should be interpreted as "based at least in part on."

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method for performing reduced latency error decoding of a received codeword that comprises a set of input symbols, the method comprising:
   determining, by a decoding server, a first syndrome, a second syndrome, and a third syndrome associated with the received codeword;
   determining, by the decoding server, that at least one of the first syndrome, the second syndrome, or the third syndrome is non-zero;
   determining, by the decoding server, a set of constant multipliers;
   performing, by a decoding logic of the decoding server, a multiplication of the first syndrome with each constant multiplier in the set of constant multipliers to generate a set of products;
   determining, by the decoding server, based at least in part on the set of products, that a first condition is satisfied with respect to the second syndrome;
   determining, by the decoding server, that a second condition is satisfied with respect to the third syndrome; and
   identifying, by the decoding server, a single input symbol in the received codeword that contains one or more bit errors based at least in part on the first condition and the second condition being satisfied; and
   correcting, by the decoding server, the one or more bit errors in the single input symbol to obtain an original codeword,
   wherein determining the set of constant multipliers comprises determining a sequence of candidate positions, wherein a respective double of each candidate position in the sequence is contained in the sequence.

2. The computer-implemented method of claim 1, wherein determining that the first condition is satisfied with respect to the second syndrome comprises determining that a first product in the set of products equals the second syndrome, wherein the first product comprises a multiplication of the first syndrome with a constant multiplier selected from the set of constant multipliers.

3. The computer-implemented method of claim 2, wherein determining that the second condition is satisfied with respect to the third syndrome comprises determining that a product of the constant multiplier and the second syndrome equals the third syndrome.

4. The computer-implemented method of claim 1, further comprising generating, by the decoding server, a polynomial comprising the set of input symbols as coefficients, wherein determining the first syndrome comprises computing a first value of the polynomial at value 1, determining the second syndrome comprises computing a second value of the polynomial at a value $\alpha$, and determining the third syndrome comprises computing a third value of the polynomial at a value $\alpha 2$, wherein the particular constant multiplier is the value $\alpha$ raised to a power p, and wherein p indicates a position of the single input symbol in the received codeword.

5. The computer-implemented method of claim 1, wherein correcting the one or more bit errors in the single input symbol comprises XORing the first syndrome with the single input symbol.

6. A decoding server for performing reduced latency error decoding of a received codeword that comprises a set of input symbols, the system comprising:
   at least one memory storing computer-executable instructions; and
   at least one processor configured to access the at least one memory and execute the computer-executable instructions to:
   determine a first syndrome, a second syndrome, and a third syndrome associated with the received codeword;
   determine that at least one of the first syndrome, the second syndrome, or the third syndrome is non-zero;
   determine a set of constant multipliers;
   perform, by a decoding logic of the decoding server, a multiplication of the first syndrome with each constant multiplier in the set of constant multipliers to generate a set of products;
   determine, based at least in part on the set of products, that a first condition is satisfied with respect to the second syndrome;
   determine that a second condition is satisfied with respect to the third syndrome; and
   identify a single input symbol in the received codeword that contains one or more bit errors based at least in part on the first condition and the second condition being satisfied; and
   correct the one or more bit errors in the single input symbol to obtain an original codeword,
   wherein determining the set of constant multipliers comprises determining a sequence of candidate positions, wherein a respective double of each candidate position in the sequence is contained in the sequence.

7. The decoding server of claim 6, wherein the at least one processor is configured to determine that the first condition is satisfied with respect to the second syndrome by executing the computer-executable instructions to determine that a first product in the set of products equals the second syndrome, wherein the first product comprises a multiplication of the first syndrome with a constant multiplier selected from the set of constant multipliers.

8. The decoding server of claim 7, wherein the at least one processor is configured to determine that the second condition is satisfied with respect to the third syndrome by executing the computer-executable instructions to determine that a product of the constant multiplier and the second syndrome equals the third syndrome.

9. The decoding server of claim 6, wherein the at least one processor is further configured to execute the computer-executable instructions to generate a polynomial comprising the set of input symbols as coefficients, wherein determining the first syndrome comprises computing a first value of the polynomial at value 1, determining the second syndrome comprises computing a second value of the polynomial at a value $\alpha$, and determining the third syndrome comprises computing a third value of the polynomial at a value $\alpha 2$, wherein the particular constant multiplier is the value $\alpha$ raised to a power p, and wherein p indicates a position of the single input symbol in the received codeword.

10. The decoding server of claim 6, wherein the at least one processor is configured to correct the one or more bit errors in the single input symbol by executing the computer-executable instructions to perform an XOR of the first syndrome with the single input symbol.

11. The decoding server of claim 6, wherein the at least one processor is configured to determine the set of constant multipliers by executing the computer-executable instructions to determine a sequence of candidate positions, wherein a respective double of each candidate position in the sequence is contained in the sequence.

12. A computer program product for performing reduced latency error decoding on a received codeword that comprises a set of input symbols, the computer program product comprising a non-transitory storage medium readable by a processing circuit of a decoding server, the storage medium storing instructions executable by the processing circuit to:
  determine a first syndrome, a second syndrome, and a third syndrome associated with the received codeword;
  determine that at least one of the first syndrome, the second syndrome, or the third syndrome is non-zero;
  determine a set of constant multipliers;
  perform, by a decoding logic of the decoding server, a multiplication of the first syndrome with each constant multiplier in the set of constant multipliers to generate a set of products;
  determine, based at least in part on the set of products, that a first condition is satisfied with respect to the second syndrome;
  determine that a second condition is satisfied with respect to the third syndrome; and
  identify a single input symbol in the received codeword that contains one or more bit errors based at least in part on the first condition and the second condition being satisfied; and
  correct the one or more bit errors in the single input symbol to obtain an original codeword,
  wherein determining the set of constant multipliers comprises determining a sequence of candidate positions, wherein a respective double of each candidate position in the sequence is contained in the sequence.

13. The computer program product of claim 12, wherein determining that the first condition is satisfied with respect to the second syndrome comprises determining that a first product in the set of products equals the second syndrome, wherein the first product comprises a multiplication of the first syndrome with a constant multiplier selected from the set of constant multipliers.

14. The computer program product of claim 13, wherein determining that the second condition is satisfied with respect to the third syndrome comprises determining that a product of the constant multiplier and the second syndrome equals the third syndrome.

15. The computer program product of claim 12, the method further comprising generating a polynomial comprising the set of input symbols as coefficients, wherein determining the first syndrome comprises computing a first value of the polynomial at value 1, determining the second syndrome comprises computing a second value of the polynomial at a value $\alpha$, and determining the third syndrome comprises computing a third value of the polynomial at a value $\alpha^2$, wherein the particular constant multiplier is the value $\alpha$ raised to a power p, wherein p indicates a position of the single input symbol in the received codeword.

16. The computer program product of claim 12, wherein correcting the one or more bit errors in the single input symbol comprises XORing the first syndrome with the single input symbol.

* * * * *